United States Patent
Baillin et al.

(10) Patent No.: US 8,884,331 B2
(45) Date of Patent: Nov. 11, 2014

(54) STRUCTURE FOR HERMETIC ENCAPSULATION OF A DEVICE AND AN ELECTRONIC COMPONENT

(71) Applicant: Commissariat a l'energie atomique et aux energies alternatives, Paris (FR)

(72) Inventors: Xavier Baillin, Crolles (FR); Jean-Louis Pornin, Crolles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/661,792

(22) Filed: Oct. 26, 2012

(65) Prior Publication Data

US 2013/0105959 A1    May 2, 2013

(30) Foreign Application Priority Data

Oct. 28, 2011  (FR) .................................... 11 59848

(51) Int. Cl.
*H01L 29/66* (2006.01)
*B81C 1/00* (2006.01)

(52) U.S. Cl.
CPC ....... *B81C 1/00285* (2013.01); *B81B 2207/012* (2013.01)
USPC .......................................... 257/137; 257/682

(58) Field of Classification Search
None
See application file for complete search history.

(56) References Cited

U.S. PATENT DOCUMENTS

| | | | | |
|---|---|---|---|---|
| 6,489,720 B1 * | 12/2002 | Gofuku et al. | ................. | 313/558 |
| 6,753,526 B2 * | 6/2004 | Vilain | ......................... | 250/338.1 |
| 6,861,719 B2 * | 3/2005 | Ouvrier-Buffet et al. | .... | 257/428 |
| 7,279,682 B2 * | 10/2007 | Ouvrier-Buffet et al. | . | 250/338.1 |
| 7,659,150 B1 * | 2/2010 | Monadgemi et al. | ......... | 438/125 |
| 8,247,771 B2 * | 8/2012 | Ouvrier-Buffet | .......... | 250/338.1 |
| 8,367,929 B2 * | 2/2013 | Baillin et al. | ................... | 174/50 |
| 8,399,299 B2 * | 3/2013 | Baillin | .......................... | 438/115 |
| 8,414,963 B2 * | 4/2013 | Baillin | ......................... | 427/97.3 |
| 2002/0175284 A1 * | 11/2002 | Vilain | ......................... | 250/338.1 |
| 2004/0092041 A1 * | 5/2004 | Ouvrier-Buffet et al. | ...... | 438/14 |
| 2004/0189195 A1 | 9/2004 | Allemand | | |
| 2007/0278605 A1 * | 12/2007 | Shibayama | ................... | 257/432 |
| 2008/0042561 A1 | 2/2008 | Allemand | | |
| 2008/0049386 A1 | 2/2008 | Pornin et al. | | |
| 2008/0213539 A1 | 9/2008 | Souriau et al. | | |
| 2010/0003789 A1 * | 1/2010 | Caplet et al. | .................. | 438/124 |
| 2010/0025832 A1 | 2/2010 | Atnip et al. | | |

(Continued)

FOREIGN PATENT DOCUMENTS

| | | | |
|---|---|---|---|
| EP | 1 878 693 A1 | 1/2008 | |
| EP | 2 141 117 A1 | 1/2010 | |

(Continued)

OTHER PUBLICATIONS

French Preliminary Search Report Issued Apr. 30, 2012 in Patent Application No. 1159848 (with English translation of Categories of Cited Documents).

*Primary Examiner* — David E Graybill

(74) *Attorney, Agent, or Firm* — Oblon, Spivak, McClelland, Maier & Neustadt, L.L.P.

(57) ABSTRACT

An encapsulation structure including at least one hermetically sealed cavity in which a device, an electronic component produced on a first substrate, and a getter material layer covering the electronic component in order to block the gases capable of being degassed by the electronic component, are enclosed. A top surface of the device is free of contact with the getter material layer.

16 Claims, 4 Drawing Sheets

(56) References Cited

U.S. PATENT DOCUMENTS

| | | |
|---|---|---|
| 2010/0025845 A1 | 2/2010 | Merz et al. |
| 2010/0178419 A1 | 7/2010 | Baillin |
| 2010/0193215 A1* | 8/2010 | Baillin ............ 174/50.5 |
| 2010/0276818 A1* | 11/2010 | Maindron et al. ............ 257/789 |
| 2010/0314544 A1* | 12/2010 | Ouvrier-Buffet ............ 250/338.4 |
| 2011/0030989 A1* | 2/2011 | Baillin et al. ............ 174/50 |
| 2011/0079425 A1* | 4/2011 | Baillin et al. ............ 174/521 |
| 2011/0079889 A1* | 4/2011 | Baillin ............ 257/682 |
| 2011/0115056 A1* | 5/2011 | Baillin ............ 257/617 |
| 2011/0284916 A1 | 11/2011 | Allemand |
| 2011/0285004 A1 | 11/2011 | Allemand |
| 2012/0313235 A1* | 12/2012 | Chu et al. ............ 257/692 |

FOREIGN PATENT DOCUMENTS

| | | |
|---|---|---|
| EP | 2 308 798 A1 | 4/2011 |
| FR | 2 883 099 A1 | 9/2006 |
| FR | 2 922 202 A1 | 4/2009 |
| WO | WO 2007/113325 A1 | 10/2007 |
| WO | WO 2007/113325 A8 | 10/2007 |
| WO | WO 2011/003908 A1 | 1/2011 |

\* cited by examiner

STRUCTURE FOR HERMETIC ENCAPSULATION OF A DEVICE AND AN ELECTRONIC COMPONENT

TECHNICAL FIELD

The invention relates to an encapsulation structure including a hermetic cavity in which a device is encapsulated, for example a microsystem or a micro-component in particular of the MEMS (microelectromechanical system), NEMS (nano-electromechanical system), MOEMS (micro-opto-electromechanical system), NOEMS (nano-opto-electro-mechanical system) type or an infrared microsensor, or more generally any device intended to be encapsulated under a controlled atmosphere, with one or more electronic components, forming, for example, an integrated circuit, and a getter material.

The invention also relates to a process for encapsulating at least one device enabling such an encapsulation structure to be produced.

PRIOR ART

Some devices such as those of the MEMS, NEMS, MOEMS, NOEMS type or infrared microsensors must, for successful operation, be hermetically enclosed or encapsulated in a cavity of which the atmosphere is controlled (control in particular of the nature of the gas and pressure in the cavity).

Such an encapsulation can be performed collectively for a plurality of devices produced on the same substrate (or wafer), called the first substrate.

Each of the devices is then encapsulated in a cavity formed by attaching and hermetically sealing a cap, for example formed by a second silicon or glass substrate, on the first substrate. This hermetic assembly between the first substrate and the second substrate, collectively forming the encapsulation cavities for the devices, makes it possible to protect the atmosphere in the cavities by preventing gas leakages between the inside of the cavities and the external environment.

Alternatively, the cavities can be formed by TFP-type encapsulation ("Thin Film Packaging"), with the caps in this case being formed by one or more superimposed thin films.

The addition of non-evaporable getters (NEG) in the cavities, for example in the form of getter material portions placed in these cavities, makes it possible to control the characteristics of the atmosphere in the cavities. The getter material portions can be produced from a deposition of a thin film of the getter material on one or the other of the two substrates, prior to the operation of assembling the two substrates. A shaping of the getter material portions in the plane of the surface of the substrate on which the getter material is deposited is then performed by implementing technological operations of photolithography and etching of the thin film of getter material. In the case of encapsulation by thin films, the getter material can be produced in the form of a thin film corresponding to the first layer of the stack forming the cap, thus forming the wall of the cap located in the cavity.

Alternatively, it is possible to deposit the getter material individually, directly in the desired shape. For this, the getter material can be deposited directly on one or the other of the two substrates by lift-off, through a photosensitive resin film previously shaped by photolithography, with this film being removed after deposition of the getter material through it.

The devices generally cooperate with electronic components, such as MOS transistors, forming part of an integrated circuit. To improve the compactness and performance, and reduce the costs of production of the structure comprised of the device(s) and integrated circuit, it is envisaged to integrate the electronic components and the devices on the same substrate, producing, for example, the devices directly on the integrated circuit(s).

Such integration nevertheless presents problems in the operation of the device(s).

Indeed, the electronic components are produced by implementing vacuum depositions of different materials from gaseous precursors, followed by photolithography and etching operations. These depositions can be of the PVD type (physical vapor deposition), and in this case comprise the implementation of cathode sputtering assisted by a rare gas such as argon or krypton. A portion of the rare gas used is then trapped in the deposited material and is capable of being released if the electronic component(s) is (are) subjected to a temperature increase. Thus, if one or more electronic component(s) is (are) encapsulated with a device in the same cavity, the rare gas trapped would then be released into the cavity during the thermal activation of the getter material also present in the cavity, with this thermal activation being capable of being performed only once the cavity has been closed. Rare gases cannot be pumped by the getter material portion(s) present in the cavity.

This gas release therefore makes it impossible to control the pressure and nature of the atmosphere in the cavity, and the device cannot therefore operate properly in this case.

Similarly, the depositions of insulating materials such as semiconductor oxides or nitrides, obtained by CVD (chemical vapor deposition) and implemented during the production of the electronic components, involve gaseous precursors such as silane ($SiH_4$) of which the decomposition, during the CVD deposition, leads to the formation of hydrogen, of which a portion may be trapped in the deposited layer.

If an electronic component comprising such an insulating material is encapsulated with a device in the same cavity, the trapped hydrogen would pass through the electronic component and would be released in the cavity during the thermal activation of the getter material present in the cavity. The hydrogen would then be pumped by the getter material portion(s) present in the cavity.

Given that these getter material portions are intended to reach a vacuum level required for the device to operate correctly (for example, a primary vacuum close to $10^{-3}$ mbar for devices comprising resonant structures, for example accelerometers or gyrometers, or of the non-cooled infrared sensor type such as microbolometers) and the activation of this getter can be performed only once the cavity has been closed by heating the entire cavity as well as the elements present in the cavity, the gases released therefore significantly limit the vacuum level capable of being reached in the cavity, or may even result in gas saturation of the getter material.

DESCRIPTION OF THE INVENTION

Thus there is a need to provide a solution for hermetically encapsulating, in the same cavity, at least one device with at least one electronic component, and making it possible to prevent any degassing caused by one or more material(s) of the electronic component from disrupting the operation of the device.

For this, one embodiment proposes an encapsulation structure comprising at least one hermetically sealed cavity in which at least the following are encapsulated:
  a device,
  an electronic component produced on a first substrate, and
  a getter material layer covering the electronic component.

Thus, the getter material layer covering the electronic component exposed in the cavity makes it possible to trap and/or block the gases capable of being degassed by the electronic component in the cavity, for example after a thermal activation of the getter material.

The getter material layer covers the electronic component in order to block the gases capable of being degassed, or emitted, by the electronic component.

The device is not covered by the getter material layer.

Given that the device and the electronic component are arranged in the same cavity, such an encapsulation structure can therefore be produced with better compactness, and therefore with a lower production cost. Moreover, given that the gases trapped in the electronic component are not released in the cavity owing to the getter material layer, the performance of the device is not degraded.

In addition, the face of the getter material layer that is arranged on the side of the integrated circuit is not exposed to the treatments to which the getter material layer is subjected, in particular a possible shaping by photolithography and etching, since these treatments are performed on the face opposite that located on the side of the electronic component and by which the gas absorption is intended to be performed.

Such an encapsulation structure is advantageously used to perform a collective encapsulation of devices for packaging under a controlled atmosphere in each cavity.

One embodiment also relates to an encapsulation structure comprising at least one hermetically sealed cavity in which at least the following are encapsulated:
  a device,
  an electronic component produced on a first substrate and including at least one material obtained either by implementing a chemical deposition from gaseous precursors, for example a CVD deposition (chemical vapor deposition), or by implementing a physical deposition, for example cathode sputtering, and
  a getter material layer covering the electronic component.

One embodiment also relates to an encapsulation structure comprising at least one hermetically sealed cavity in which at least the following are encapsulated:
  a device,
  an electronic component produced on a first substrate and including at least one material containing gas molecules capable of being released under the effect of a heat treatment, and
  a getter material layer covering the electronic component.

Preferably, the getter material integrally covers the electronic component. However, it is possible that the getter material will only partially cover the electronic component. In this case, a second getter may be arranged in the cavity so as to pump the gases released through the part of the surface of the electronic component not covered by the getter material.

The device may be of the MEMS, and/or NEMS, and/or MOEMS, and/or NOEMS type, and/or an infrared sensor, and/or the electronic component may be an MOS-type transistor.

The device may be of at least one of the MEMS, or NEMS, or MOEMS, or NOEMS type, or an infrared sensor, and/or the electronic component is an MOS-type transistor.

The electronic component may be part of an integrated circuit produced on the first substrate and of which at least a part is arranged under the cavity.

The encapsulation structure may also comprise a dielectric layer placed between the electronic component and the getter material layer.

This dielectric layer makes it possible to ensure electrical insulation between the electronic component and the getter material layer.

The cavity may be formed between the first substrate and a second substrate secured to the first substrate, or between the first substrate and a cap including one or more thin films secured to the first substrate. When the cavity is formed between the first substrate and the second substrate, the seal between the two substrates may be ensured by a sealing bead, or be obtained by direct bonding (molecular bonding) or an anode seal directly between the two substrates. The cavity may also be obtained by implementing a TFP-type encapsulation process.

In one particular embodiment, the device may be produced on the second substrate.

In this case, the device and the electronic component may be arranged one opposite the other in the cavity, without being in contact with one another. In this case, the getter material preferably covers the entire surface of the first substrate exposed to the inside of the cavity.

In another particular embodiment, the device may be produced on, or over, the getter material layer. Such a configuration makes it possible to superimpose the device on the integrated circuit, without disrupting the operation of the device. Such a configuration also makes it possible to easily electrically connect the electronic component to the device in consideration of the proximity of these two elements.

The device may also be placed on the first substrate and on the second substrate. A device may also be produced on each of the substrates.

The encapsulation structure may also comprise at least one passivation layer placed between the getter material layer and the device.

Such a passivation layer can ensure electrical insulation between the getter material layer and the device.

The encapsulation structure may also comprise at least one first electrical connection electrically connecting the device to the electronic component through the getter material layer, and at least one second electrical connection electrically connecting the electronic component to at least one electrical contact placed outside of the cavity (forming one or more electrical contacts in front face), with the first and second electrical connections being capable of being electrically insulated from the getter material layer.

The encapsulation structure may also comprise at least one getter material portion distinct from the getter material layer and arranged in the cavity. This getter material portion can thus contribute to the control of the atmosphere in the cavity, and in particular contribute to obtaining the vacuum level required for the operation of the device.

The encapsulation structure may also comprise one or more electrical connections passing through the first substrate and electrically connecting the electronic component to one or more electrical contacts (corresponding, for example, to electrical contacts at the rear face) arranged outside of the cavity, for example on a rear face of the first substrate. It is thus possible to establish the electrical contacts of the electronic component via the rear face of the first substrate.

The getter material layer may comprise a stack formed by at least one first layer comprising titanium and covering the electronic component, a second layer comprising nickel and covering the first layer, and a third layer comprising titanium and covering the second layer.

Another embodiment relates to a process for encapsulating at least one device and at least one electronic component in a cavity, comprising at least the steps of:
  producing the electronic component on a first substrate;

producing at least one getter material layer covering the electronic component;

producing the device;

hermetically sealing the cavity so that the electronic component and the device are encapsulated in the cavity.

The electronic component may comprise at least one material obtained by implementing a deposition, for example, of the CVD type or by cathode sputtering.

The electronic component may comprise at least one material containing gas molecules capable of being released under the effect of a heat treatment, i.e. a temperature increase.

This process therefore makes it possible to form a cavity under controlled atmosphere between a substrate and a cap, this cavity comprising at least one device forming an active element, the substrate and/or the cap comprising at least one electronic component capable of forming part of an electronic integrated circuit and exposed to the inside of the cavity, wherein this process consists of performing at least one getter material deposition on the cap and/or on the substrate so as to cover the electronic component, prior to the production of the device and/or before the hermetic sealing of the cavity.

The getter material layer is therefore deposited directly on a planar substrate and may be shaped by traditional photolithography and etching operations.

The step of hermetically sealing the cavity may comprise the securing of a second substrate to the first substrate, or the production of a cap including one or more thin films secured to the first substrate.

The device may be produced on the second substrate.

Alternatively, the device may be produced on, or above, the getter material layer.

The encapsulation process may also comprise, between the step of producing the getter material layer and the step of producing the device, a step of producing at least one passivation layer on the getter material layer, with the device being capable of being produced on the passivation layer.

The encapsulation process may also comprise, before the hermetic sealing of the cavity, the production of at least one first electrical connection electrically connecting the device to the electronic component through the getter material layer, and at least one second electrical connection electrically connecting the electronic component to at least one electrical contact placed outside the cavity, with the first and the second electrical connections being capable of being electrically insulated from the getter material layer.

The encapsulation process may also comprise, before the hermetic sealing of the cavity, the production of at least one getter material portion distinct from the getter material layer and arranged in the cavity.

The encapsulation process may also comprise the production of one or more electrical connections passing through the first substrate and electrically connecting the electronic component to one or more electrical contacts placed outside the cavity, for example on a rear face of the first substrate.

BRIEF DESCRIPTION OF THE DRAWINGS

This invention will be easier to understand in view of the examples of embodiments provided purely for indicative and non-limiting purposes, in reference to the appended drawings wherein.

Identical, similar or equivalent parts of the different figures described below have the same numeric references for the sake of clarity between figures.

The different parts shown in the figures are not necessarily shown according to a uniform scale, so as to make the figures more legible.

The different possibilities (alternatives and embodiments) must be understood as being not mutually exclusive and can be combined with one another.

DETAILED DESCRIPTION OF PARTICULAR EMBODIMENTS

Figure 1:
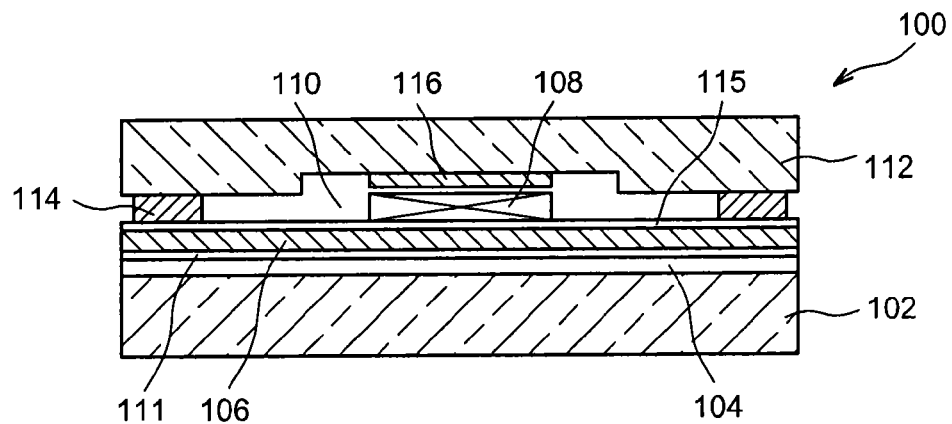
FIGS. 1 to 3 and 5 to 7 show a plurality of encapsulation structures according to different embodiments.

Reference is made to FIG. 1, which shows an encapsulation structure 100 according to a first embodiment.

The structure 100 comprises a first substrate 102 on which an integrated circuit 104 is produced, shown diagrammatically in FIG. 1 in the form of an active layer arranged on the first substrate 102. The integrated circuit 104 comprises in particular MOS-type devices such as CMOS transistors. The integrated circuit 104 is covered with a dielectric layer 111 covering in particular electrical contact pads of the integrated circuit 104 and enabling the integrated circuit 104 to be electrically insulating from the elements of the structure 100 intended to be produced on the integrated circuit 104.

The integrated circuit 104 and the dielectric layer 111 are covered with a getter material layer 106, comprising at least one getter material capable of performing gas absorption and/or adsorption, advantageously titanium, or zirconium, or an alloy comprising titanium and zirconium. The getter material layer 106 can also be used to form a barrier with respect to the rare gases capable of being released by the integrated circuit 104. The thickness of the getter material layer 106 is, for example, between several dozen nanometers and several micrometers (for example, less than 10 µm). It is possible for the getter material layer 106 to correspond to a multilayer, comprising one or more getter material layers superimposed one on another, and capable of comprising a sub-layer making it possible to adjust the thermal activation temperature of the getter material(s) arranged on this adjustment sub-layer. Such a multilayer is, for example, described in the document US 2010/178419 A1.

The getter material layer 106 is advantageously produced in the form of a stack of Ti/Ni/Ti-type layers making it possible in particular to effectively trap the hydrogen molecules capable of being released by the electronic components of the integrated circuit 104. Indeed, with such a multilayer, the first layer comprised of titanium located on the side of the integrated circuit 104 is capable of trapping gases, such as dioxygen, capable of being released by the integrated circuit 104, and capable of blocking rare gases (for example argon and/or krypton), which may also be released by the integrated circuit 104. The second layer comprising nickel makes it possible to allow hydrogen molecules, capable of being released by the integrated circuit 104, to pass, these molecules being capable of then being absorbed by the third titanium layer preferably produced with a thickness greater than that of the first titanium layer.

The second nickel layer serves as a "filter" allowing only the hydrogen molecules to pass, thus protecting the third titanium layer from the other gaseous species.

It is also possible that the getter material layer 106 comprises palladium, which enables to effectively absorb hydrogen molecules.

A device 108, for example a MEMS-type micro-device, is produced on the getter material layer 106. This device 108 is encapsulated in a cavity 110 formed between the first substrate 102 and a second substrate 112 secured to the first substrate 102 by means of a sealing bead 114, for example comprising at least one fusible material.

Finally, a part of the face of the second substrate 112 located inside the cavity 110 and forming an upper wall of the cavity 110 is covered by another getter material portion 116.

The encapsulation structure 100 therefore comprises a device 108 encapsulated in a cavity 110, with at least a part of the integrated circuit 104 being exposed in the cavity 110. During the thermal activation of the getter material layer 106 and the getter material portion 116, owing to the fact that the getter material layer 106 covers at least the part of the integrated circuit 104 located in the cavity 110, the gases trapped in the integrated circuit 104 that are released by it during this thermal activation are therefore blocked and/or captured by the getter material layer 106 that covers the integrated circuit 104. The encapsulation structure 100 is advantageously produced so that the entire surface of the integrated circuit 104 located in the cavity 110 is covered by the getter material layer 106.

Given that the getter material layer 106 is intended to absorb and/or adsorb gases released by its internal face, i.e. its face located opposite the integrated circuit 104, the microstructure of the getter material layer 106 has less of an influence on the gas absorption and/or adsorption capacities than in the case of a getter material portion or layer intended to absorb and/or adsorb gases by its external surface (surface exposed to the atmosphere of the cavity, as is the case for the getter material portion 116).

Indeed, when a getter material is intended to absorb and/or adsorb gases by its external surface, the getter effect is obtained when the getter material has a columnar structure with small grains of which the diameter is, for example, approximately several dozen nanometers (for example between around 20 and 90 nm), thus facilitating the diffusion of the species at the grain boundaries and therefore the capture of gases at low temperature, typically between around 200° C. and 450° C. By contrast, in the case of the getter material layer 106, the getter effect (gaseous absorption and/or adsorption) can be obtained even if the microstructure of the getter material has larger grains, of which the diameter is, for example, approximately several hundred nanometers (for example between around 100 nm and 900 nm). The getter material layer 106 covering the integrated circuit 104 can therefore be produced by a PVD-type deposition, for example by cathode sputtering or evaporation. In addition, this getter material can be comprised of a single material, such as titanium, zirconium or any other metal having a gas absorption/adsorption capacity, in particular with respect to hydrogen, or capable of forming metal hydrides sufficiently stable in temperature.

Optionally, and as shown in FIG. 1, it is possible to cover the getter material layer 106 with a dielectric passivation layer 115 before the production of the device 108 so as to electrically insulate the device 108 from the getter material layer 106. This passivation layer 115 has, for example, a thickness of between several dozen nanometers and several microns (thickness, for example, less than around 10 μm). Aside from its role as an electrical insulator, the passivation layer 115 also makes it possible to block the diffusion of hydrogen capable of being released by the integrated circuit 104, with this gas molecule blocking function being obtained when the thickness of the passivation layer 115 is greater than several nanometers.

The layer 115 may correspond to a layer for passivation of the getter material layer 106, i.e. comprise, for example, $TiO_2$ for a getter comprised of titanium, or $ZrO_2$ for a getter comprising zirconium, on which an electrical insulation layer, for example, comprising $SiO_2$ is advantageously deposited.

In the example of FIG. 1, the integrated circuit 104 occupies the entire surface of the first substrate 102 located in the cavity 110. It is nevertheless possible for the integrated circuit 104 to occupy only a part of the surface of the substrate 102 located in the cavity 110. In this case, the getter material layer 106 directly or indirectly covering the integrated circuit 104 can be shaped by photolithography and etching operations so that it covers only the integrated circuit 104, or the integrated circuit 104 and a part of the substrate 102 not covered by the integrated circuit 104.

Figure 2:
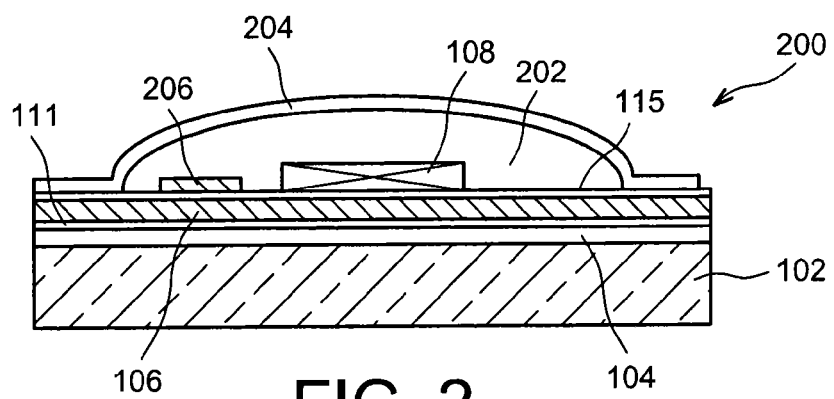

FIG. 2 shows an encapsulation structure 200 according to a second embodiment.

Like the encapsulation structure 100 described above, the encapsulation structure 200 comprises the first substrate 102, the integrated circuit 104 covered with the dielectric layer 111, the getter material layer 106 covering the dielectric layer 111, as well as the device 108. As above, a dielectric layer 115 may cover the getter material layer 106 so as to electrically insulate the device 108 from the getter material layer 106.

Unlike the encapsulation structure 100 comprising a cap formed by the second substrate 112 secured to the first substrate 102, the encapsulation structure 200 comprises a cavity 202 in which the device 108 and the integrated circuit 104 are encapsulated, and formed between the first substrate 102 and one or more thin films 204 produced by a TFP-type process (including in particular the production of a sacrificial material portion enabling the deposition of the layers intended to form the cap to be performed).

The encapsulation structure 200 also comprises one or more getter material portions 206 arranged in the cavity 202, on the passivation layer 115 (or directly on the getter material layer 106 if this passivation layer 115 is absent), next to the device 108.

In an alternative of this second embodiment, when the cap 204 is formed by a superposition of at least two thin films, the layer forming the interior wall of the cavity 202 may comprise at least one getter material. In this case, it is possible to not produce getter material portions 206 next to the device 108 and just the same to obtain the desired atmosphere in the cavity 202 enabling successful operation of the device 108 to be obtained.

Figure 3:
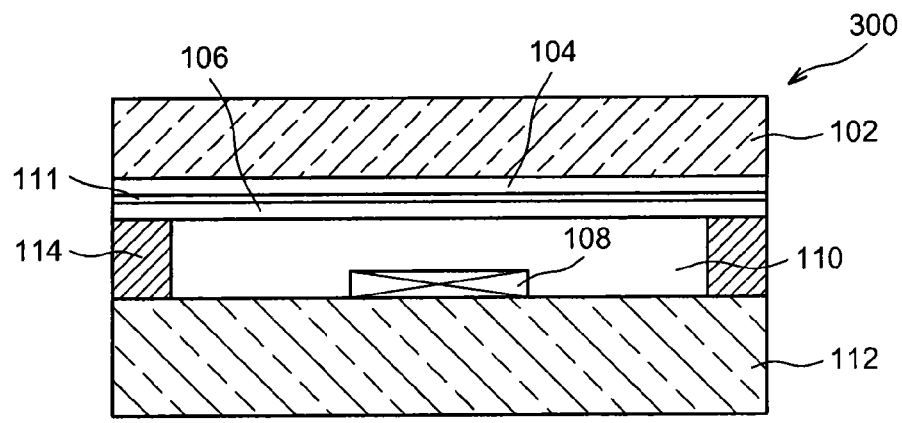

Reference is made to FIG. 3, which shows an encapsulation structure 300 according to a third embodiment.

Like the encapsulation structure 100, the encapsulation structure 300 comprises the cavity 110 formed between the first substrate 102 and the second substrate 112 and in which the device 108 and at least one part of the integrated circuit 104 are encapsulated. However, in this third embodiment, the integrated circuit 104 is produced on the first substrate 102, which forms the cap of the cavity 110. The device 108 is therefore produced not on the integrated circuit 104, but directly on and/or in the second substrate 112. As in the previous embodiments, the integrated circuit 104 is covered by the getter material layer 106 making it possible to absorb and/or adsorb the gases released by the materials of the integrated circuit 104 during the thermal activation of the getter material present in the encapsulation structure 300. While not shown, it is possible for one or more getter material portions, for example similar to the portion 206 described above, to be produced on the second substrate 112, next to the device 108, or on the first substrate 102, against the getter material layer 106. It is also possible for another getter material layer to be produced on the second substrate 112, with the device 108 being produced on this other getter material layer. This other getter material layer may be electrically insulated from the device 108 by a dielectric layer, for example, equivalent to the passivation layer 115.

The first and third embodiments can be combined so that an encapsulation structure comprises the first substrate 102 on which the integrated circuit 104 and the device 108 are produced, as shown in FIG. 1, and also comprises a second substrate, forming the cap, on which another integrated circuit covered with a getter material layer is also produced.

Although the encapsulation structures 100 and 200 have been previously described as encapsulating a single device 108, a plurality of devices can be encapsulated in each of the cavities 110 and 202 of the encapsulation structures 100 and 200. However, the encapsulation structures 100 and 200 are preferably produced so that they individually encapsulate the devices in a plurality of cavities produced collectively between the first substrate 102 and the second substrate 112, and/or between the first substrate 102 and caps similar to the cap 204.

We will now describe an example of an embodiment of the encapsulation structure 100, i.e. a first example of a process for encapsulating the device 108.

First, the integrated circuit 104 is produced on the first substrate 102 by implementing traditional microelectronic steps. The integrated circuit 104 is then covered with the dielectric layer 111 making it possible in particular to electrically insulate the integrated circuit 104 from the getter material layer 106, which will then be produced.

The layer, or stack of layers, of getter material 106 is then produced so that it entirely or partially covers the integrated circuit 104.

A dielectric passivation layer 115, for example comprising semiconductor oxide and/or nitride (for example silicon), can then be produced on the getter material layer 106. The material(s) of this passivation layer 115 are preferably chosen so as to be as unpropitious to degassing after their productions and when they are subjected to a heat treatment.

This passivation layer 115, for example, comprises $SiO_2$ deposited by evaporation (step capable of being linked after the deposition of the getter material layer 106 in the same deposition equipment).

The passivation layer 115 can also be produced by implementing a controlled dry nitriding and/or oxidation of the getter material of the layer 106, thus causing the growth of this oxide and/or of this nitride. Such an oxidation and/or nitriding may be performed at a temperature of between around 150° C. and 250° C., under dioxygen and/or dinitrogen dry atmosphere, at a pressure greater than or equal to around $10^{-3}$ mbar for several minutes. The passivation layer 115 obtained then corresponds to a metal oxide layer of which the electrical features confer on it both a role of hydrogen diffusion barrier and electrical insulator with respect to the integrated circuit 104. This electrical insulation is advantageously reinforced by a deposition of insulating material such as $SiO_2$.

Advantageously, a heat treatment is then performed, for example at a temperature of between around 300° C. and 450° C., advantageously under a secondary vacuum, for a period of between several minutes and around 1 hour. Such a heat treatment enables the getter material layer 106 to trap the gases coming from the integrated circuit 104. Indeed, under the action of the temperature, the getter material is activated while the gases trapped escape to the outside of the integrated circuit 104. It also makes it possible to degas the passivation layer 115. The substrate is thus ready for subsequent technological steps.

This heat treatment therefore makes it possible to stabilize, with respect to its propensity to degas, the stack including the getter material layer 106 and the passivation layer 115.

Figure 4A:
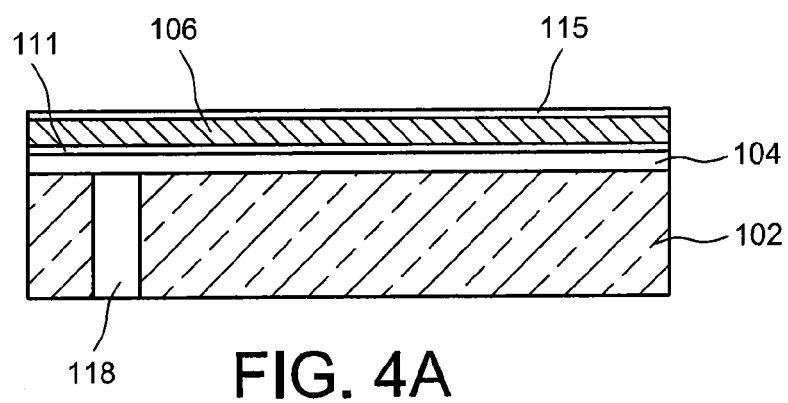
FIGS. 4A and 4B show different contacts that can be established on the first substrate of the encapsulation structure.

Then the electrical contacts are established on the integrated circuit 104. This establishment of contacts can be performed by the rear face of the integrated circuit 104, i.e. the face of the integrated circuit 104 located against the substrate 102. Thus, as shown in FIG. 4A, one or more vias 118 are produced through the substrate 102, forming one or more accesses to the rear face of the integrated circuit 104. An electrically conductive material is then deposited in this or these vias to form one or more electrical connections electrically connected to the integrated circuit 104.

The device 108 is then produced on the passivation layer 115, by implementing steps of deposition, photolithography and etching.

The cavity 110 is then closed by securing the second substrate 112 to the first substrate 102, with the getter material portion 116 first being produced against the second substrate 112.

With respect to the production of the encapsulation structure 100, the production of the encapsulation structure 200 comprises the production of the getter material portion 206 on the passivation layer 115, next to the device 108. The cavity 202 is closed by covering the device 108 and the getter material portion 206 by a sacrificial material layer, which is then etched so that a remaining portion of sacrificial material corresponds to the desired volume of the cavity 202. The sacrificial material portion is then covered with one or more thin films (of which that located against the sacrificial material portion can comprise getter material), forming the cap 204. The sacrificial material portion is then etched via a release hole produced through the cap 204, with the hole then being plugged.

The encapsulation structure 300 is obtained by producing the device 108 directly on the first substrate 102. In parallel, the integrated circuit 104 is produced on the second substrate 112, and the integrated circuit 104 is then covered by the getter material layer 106 and optionally a passivation layer.

The two substrates 102 and 112 are then secured to one another so as to close the cavity 110.

The electrical contacts are established through the second substrate 112.

Figure 4B:
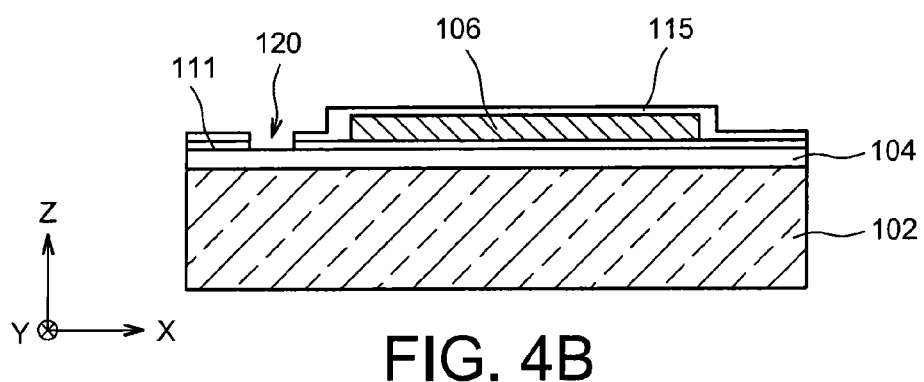

Alternatively, regardless of the encapsulation structure considered, it is possible to establish electrical contacts at the level of a front face of the integrated circuit 104, i.e. at the level of the face of the integrated circuit 104 located on the side of the cavity. In this case, after the integrated circuit 104 covered with the getter material layer 106 has been produced, the latter can be etched so that a remaining portion of getter material 106 covers the part of the integrated circuit 104 intended to be encapsulated in the cavity with the device 108. The remaining portion of the getter material layer 106 can then be covered with the passivation layer 115, which also covers one or more parts of the integrated circuit 104 that are not intended to be exposed in the cavity. It is thus possible to produce one or more electrical contacts by etching one or more accesses 120 to the integrated circuit 104 at the level of the contact zones of the integrated circuit 104 intended to be located outside of the cavity, through the passivation layer 115 and optionally the dielectric layer 111 (see FIG. 4B). These accesses 120 are then metalized so as to form contact electrically connected to the integrated circuit 104. Such a contact is advantageously established for a TFP-type encapsulation (like the encapsulation structure 200).

Figure 5:
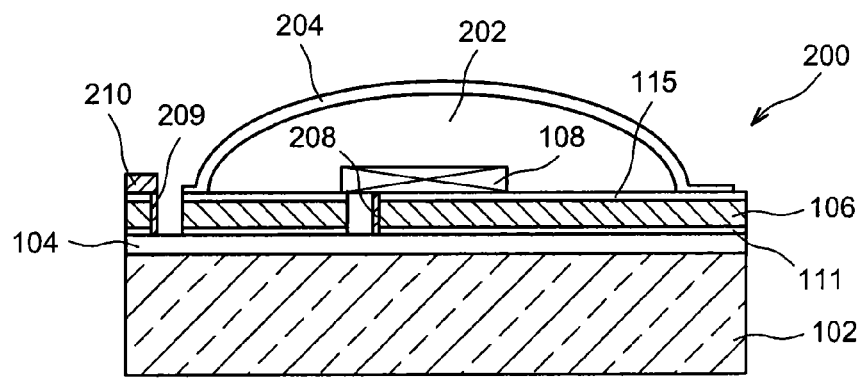

FIG. 5 shows the encapsulation structure 200 according to a first alternative embodiment, wherein the electrical contacts are established at the level of the front face of the integrated circuit 104.

It can be seen in this figure that the integrated circuit 104 is electrically connected to the device 108 by a first electrical connection 208 that passes through the getter material layer 106, the passivation layer 115 and the dielectric layer 111. A second electrical connection 209 makes it possible to electrically contact the integrated circuit 104 from the outside of the cavity 202, with this second connection 209 passing through the passivation layer 115 so as to lead onto the front face of the encapsulation structure 200 and be connected to an electrical contact 210 formed on the front face. The electrical connections 208 and 209 are electrically insulated from the getter material layer 106, for example by surrounding the electrically conductive material of these connections with a dielectric material first placed in the holes formed through the getter material layer 106 and the passivation layer 115.

Figure 6:
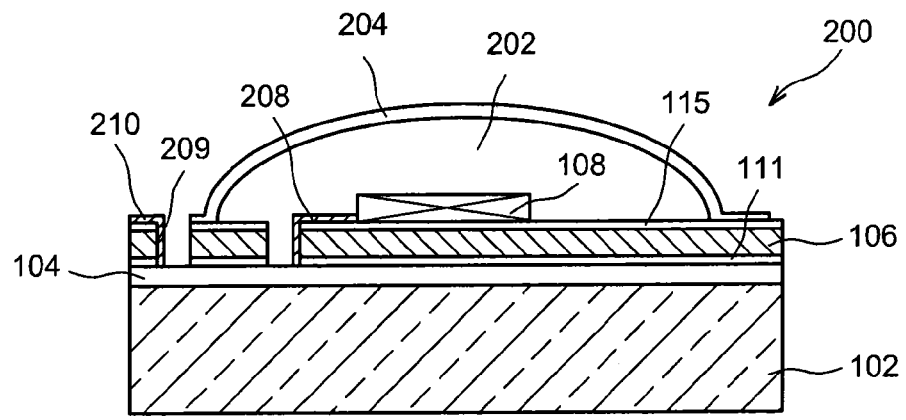

FIG. 6 shows the encapsulation structure 200 according to a second alternative embodiment. With respect to the first alternative embodiment shown in FIG. 5, the electrical connection 208 is located on the side of the device 108 and comprises two parts perpendicular to one another, one being in the plane of the device 108, and the other being in a plane perpendicular to the device 108 and passing through the layers 106, 111 and 115.

Figure 7:
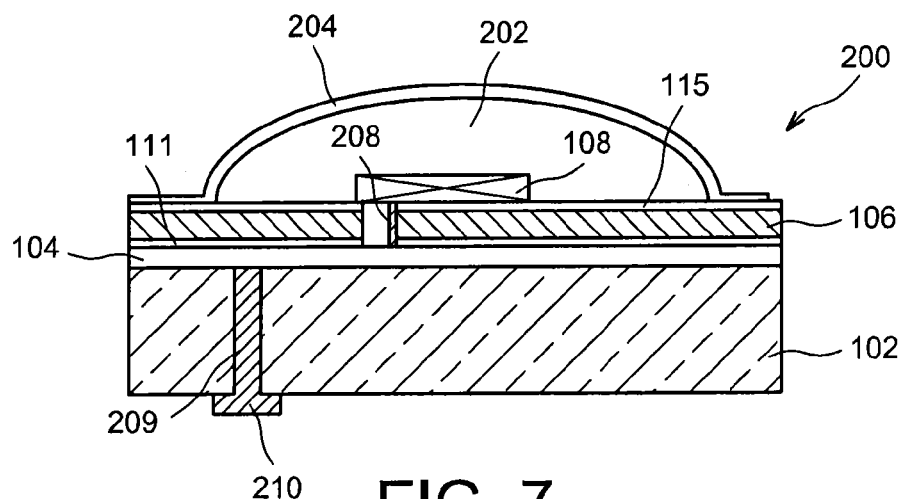

In a third alternative shown in FIG. 7, the second electrical connection 209 passes through the substrate 102 so as to lead onto the rear face of the substrate 102 and be in contact with an electrical contact 210 produced at the level of the rear face of the substrate 102.

The invention claimed is:

1. An encapsulation structure comprising:
at least one hermetically sealed cavity,
wherein the cavity encapsulates
a device,
an electronic component produced on a first substrate, and
a getter material layer covering the electronic component in order to block the gases capable of being degassed by the electronic component,
wherein a top surface of the device is free of contact with the getter material layer,
wherein the device is produced over the getter material layer,
wherein the encapsulation structure further comprises:
at least one first electrical connection electrically connecting the device to the electronic component through the getter material layer; and
at least one second electrical connection electrically connecting the electronic component to at least one electrical contact placed outside of the cavity, and
wherein the first and second electrical connections are electrically insulated from the getter material layer.

2. The encapsulation structure according to claim 1, wherein at least one of the device is of at least one of the MEMS, or NEMS, or MOEMS, or NOEMS type, or an infrared sensor, or the electronic component is an MOS-type transistor.

3. The encapsulation structure according to claim 1, wherein the electronic component is part of an integrated circuit produced on the first substrate and of which at least a part is arranged under the cavity.

4. The encapsulation structure according to claim 1, further comprising a dielectric layer placed between the electronic component and the getter material layer.

5. The encapsulation structure according to claim 1, wherein the cavity is formed between the first substrate and a second substrate secured to the first substrate, or between the first substrate and a cap including one or more thin films secured to the first substrate.

6. The encapsulation structure according to claim 5, wherein the device is produced on the second substrate.

7. The encapsulation structure according to claim 1, further comprising at least one passivation layer placed between the getter material layer and the device.

8. The encapsulation structure according to claim 1, further comprising at least one getter material portion distinct from the getter material layer and arranged in the cavity.

9. The encapsulation structure according to claim 1, further comprising one or more electrical connections passing through the first substrate and electrically connecting the electronic component to one or more electrical contacts arranged outside of the cavity.

10. The encapsulation structure according to claim 1, wherein the getter material layer comprises a stack formed by at least one first layer comprising titanium and covering the electronic component, a second layer comprising nickel and covering the first layer, and a third layer comprising titanium and covering the second layer.

11. A process for encapsulating at least one device and at least one electronic component in a cavity, comprising:
producing the electronic component on a first substrate;
producing at least one getter material layer covering the electronic component in order to block the gases capable of being degassed by the electronic component;
producing the device;
hermetically sealing the cavity so that the electronic component and the device are encapsulated in the cavity,
wherein a top surface of the device is free of contact with the getter material layer,
wherein the device is produced over the getter material layer, and
wherein the process further comprises:
before the hermetic sealing of the cavity, producing at least one first electrical connection electrically connecting the device to the electronic component through the getter material layer, and
producing at least one second electrical connection electrically connecting the electronic component to at least one electrical contact placed outside the cavity, with the first and the second electrical connections being electrically insulated from the getter material layer.

12. The encapsulation process according to claim 11, wherein the step of hermetically sealing the cavity comprises the securing of a second substrate to the first substrate, or the production of a cap including one or more thin films secured to the first substrate.

13. The encapsulation process according to claim 12, wherein the device is produced on the second substrate.

14. The encapsulation process according to claim 11, further comprising, between the step of producing the getter material layer and the step of producing the device, a step of producing at least one passivation layer on the getter material layer, with the device being produced on the passivation layer.

15. The encapsulation process according to claim 11, further comprising, before the hermetic sealing of the cavity, producing at least one getter material portion distinct from the getter material layer and arranged in the cavity.

16. The encapsulation process according to claim 11, further comprising producing one or more electrical connections passing through the first substrate and electrically connecting the electronic component to one or more electrical contacts placed outside the cavity.

* * * * *